(12) United States Patent
Matsuda (10) Patent No.: US 6,465,333 B2
(45) Date of Patent: Oct. 15, 2002

(54) METHOD OF MANUFACTURING A CIRCUIT

(75) Inventor: Tomoko Matsuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/828,890

(22) Filed: Apr. 10, 2001

(65) Prior Publication Data

US 2001/0031544 A1 Oct. 18, 2001

(30) Foreign Application Priority Data

Apr. 13, 2000 (JP) .......................................... 2000-112334

(51) Int. Cl.$^7$ ............................................ H01L 21/261
(52) U.S. Cl. ........................ 438/512; 438/530; 438/495; 438/795; 438/916
(58) Field of Search ................................ 438/512, 510, 438/495, 542, 918, 530, 795, 916, 289, 301, 528, 525, 224, 303, 302; 427/527

(56) References Cited

U.S. PATENT DOCUMENTS 4,928,156 A * 5/1990 Alvis et al. ................. 357/23.4
5,861,335 A * 1/1999 Hause et al. ................. 438/308
6,043,139 A * 3/2000 Eaglesham et al. .......... 438/495
6,221,724 B1 * 4/2002 Yu et al. ...................... 438/289

FOREIGN PATENT DOCUMENTS

JP  2000-114197  4/2000

* cited by examiner

*Primary Examiner*—Matthew Smith
*Assistant Examiner*—Igwe U. Anya
(74) *Attorney, Agent, or Firm*—Sughrue Mion, PLLC (57) ABSTRACT

When the temperature of a silicon substrate is increased, a first annealing gas which is mainly composed of argon or the like that does not react with said silicon substrate with a trace of oxygen added thereto, is supplied to the position of the silicon substrate to prevent any unwanted reaction from occurring on the silicon substrate whose temperature is increasing. When the temperature of the silicon substrate is lowered, a second annealing gas which is mainly composed of nitrogen or the like which has a high thermal conductivity is supplied to the silicon substrate to quickly lower the temperature of the silicon substrate and prevent a doped impurity from being undesirably diffused.

4 Claims, 9 Drawing Sheets

METHOD OF MANUFACTURING A CIRCUIT

BACKGROUND OF THE INVENTION

1. Field of the Invention

The present invention relates to a method of and an apparatus for manufacturing a circuit by activating an impurity doped in a silicon substrate according to an annealing process.

2. Description of the Related Art

MOS (Metal Oxide Semiconductor) transistors that are used in logic circuits in recent years have a LDD (Lightly Doped Drain-source) region added inwardly of an ordinary source/drain region for suppressing the generation of a hot carrier and preventing the breakdown voltage from being lowered.

Since, however, the power supply voltage of present MOS transistors is lowered, the above aims are less important in those MOS transistors. It has been attempted to increase the concentration of the impurity in the LDD region to lower the resistance thereof. Such a region is referred to as an extension region, which is lower in concentration than the ordinary source/drain region but higher in concentration and shallower than the conventional LDD region.

Figure 1:
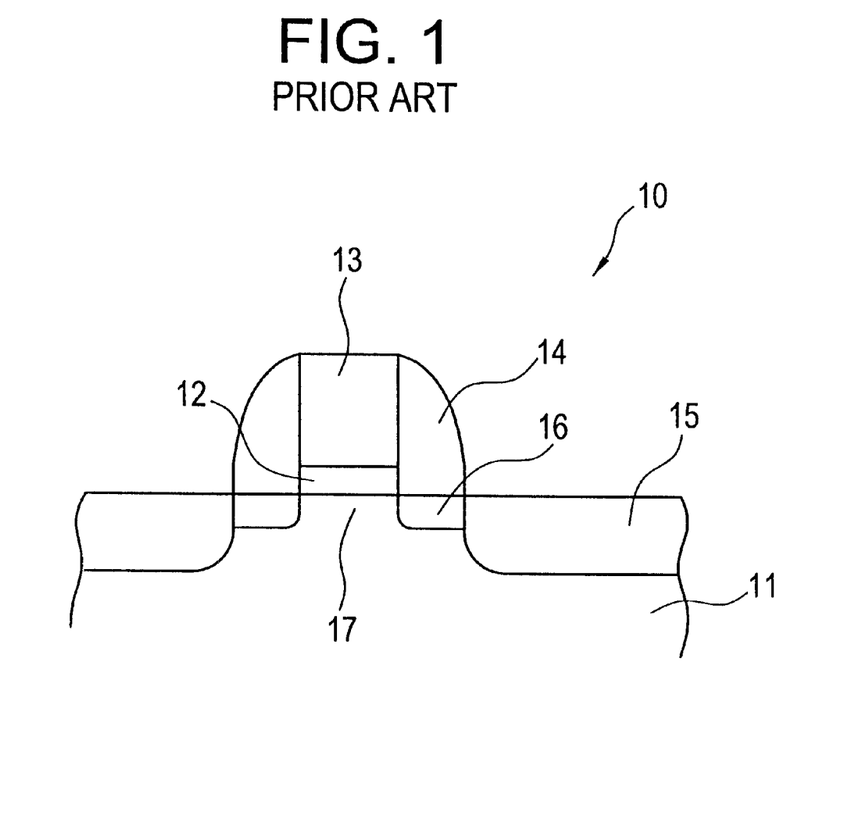
FIG. 1 is a schematic vertical cross-sectional view of an internal structure of a MOS transistor.

One conventional MOS transistor 10 of the above structure will be described below with reference to FIG. 1 of the accompanying drawings. Conventional MOS transistor 10 is of the p type and has gate insulating film 12 and p-type gate electrode 13 that are successively deposited in a given pattern on the surface of n-type silicon substrate 11, with side walls 14 being disposed on both sides of gate insulating film 12 and p-type gate electrode 13.

A pair of p-type source/drain regions 15 is disposed in a surface layer of silicon substrate 11 outwardly of side walls 14. A pair of p-type extension regions 16 with one channel region 17 interposed therebetween is disposed in a surface layer of silicon substrate 11 inwardly of p-type source/drain regions 15.

With MOS transistor 10 of the above structure, because p-type extension regions 16 are disposed inwardly of p-type source/drain regions 15, it is possible to suppress the generation of a hot carrier and prevent the breakdown voltage from being lowered, as is the case with the conventional LDD structure. Nevertheless, MOS transistor 10 is lower in resistance than the conventional LDD structure.

In MOS transistor 10, gate insulating film 12 is formed as a thermally oxidized film of silicon substrate 11. In order to allow gate insulating film 12 to function as a p channel, a p-type impurity such as boron is introduced in source/drain regions 15, extension regions 16, and gate electrode 13.

A process of manufacturing such MOS transistor 10 will briefly be described below. First, the surface of silicon substrate 11 is heat-treated to form a thermally oxidized film on its entire surface, and gate electrode 13 is formed in a given pattern on the surface of the thermally oxidized film.

Figure 2A:
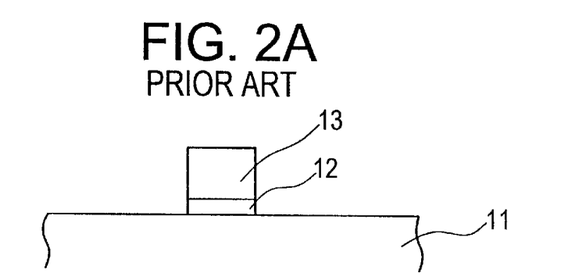
FIGS. 2A through 2D are schematic vertical cross-sectional views showing a method of manufacturing a MOS transistor.

Using gate electrode 13 as a mask, the thermally oxidized film is subjected to a dry etching process. In the dry etching process, the thermally oxidized film is removed from the surface of silicon substrate 11 which is not masked by gate electrode 13, producing gate insulating film 12 of the thermally oxidized film that remains unremoved beneath gate electrode 13, as shown in FIG. 2A of the accompanying drawings.

Figure 2B:
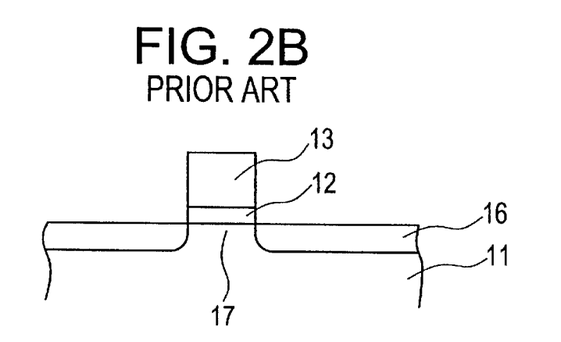
Figure 2C:
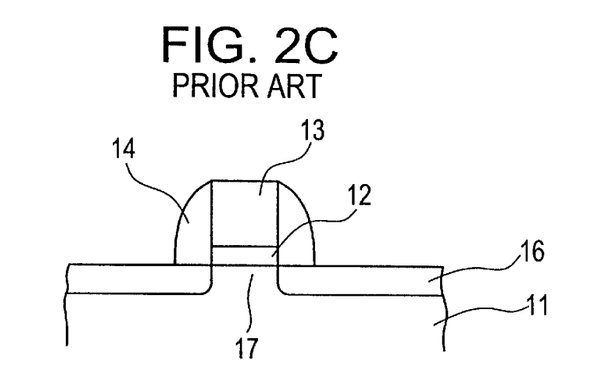

Then, as shown in FIG. 2B of the accompanying drawings, using gate electrode 13 as a mask, the surface layer of silicon substrate 11 is lightly doped with a p-type impurity in the position of extension regions 16. As shown in FIG. 2C of the accompanying drawings, side walls 14 are deposited on both sides of gate insulating film 12 and gate electrode 12 on the surface of silicon substrate 11 with the impurity injected therein by ion implantation.

Figure 2D:
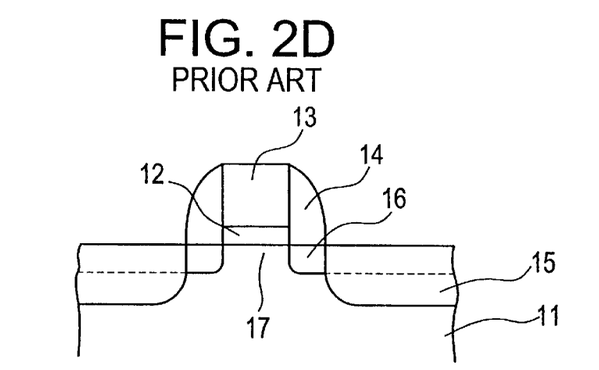

Thereafter, as shown in FIG. 2D of the accompanying drawings, using side walls 14 as a mask, the surface layer of silicon substrate 11 is deeply doped with a p-type impurity in the position of source/drain region 15. The impurity injected by ion implantation in silicon substrate 11 is activated by an annealing process, thereby forming source/drain region 15 and extension regions 16. In this manner, p-type MOS transistor 10 is completed as shown in FIG. 1.

Figure 3A:
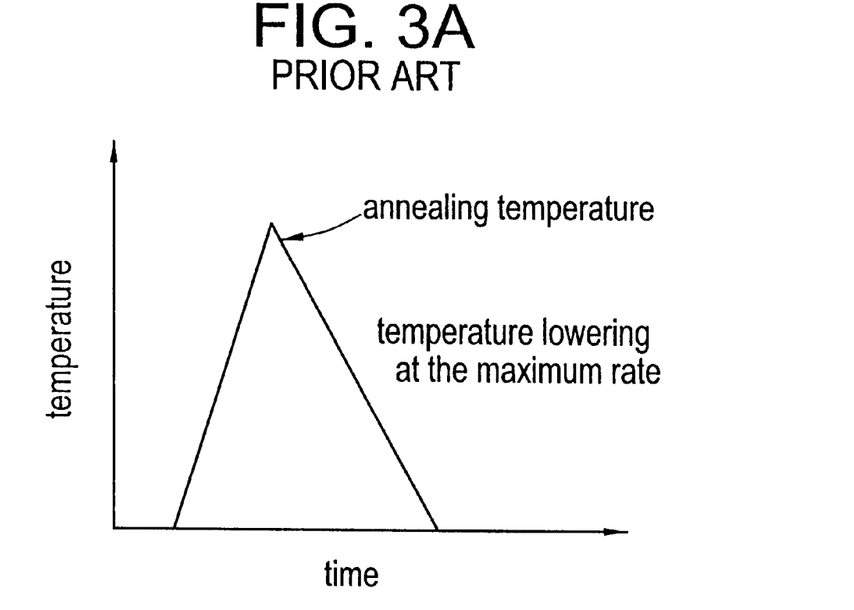
FIGS. 3A and 3B are diagrams showing the characteristics of conventional methods of manufacturing a circuit.

For annealing silicon substrate 10 to form source/drain region 15 and extension regions 16, an RTA (Rapid Thermal Annealing) process is generally used at present. According to the RTA process, as shown in FIG. 3A of the accompanying drawings, silicon substrate 11 placed in the atmosphere of an annealing gas of nitrogen and argon is increased in temperature to an annealing temperature of about 1000° C. at a maximum rate of the fabrication apparatus and then lowered in temperature to normal temperature at the maximum rate.

Since the temperature of silicon substrate 11 is increased and lowered at the maximum rate and directly changes from the temperature increasing mode to the temperature lowering mode according to a spike annealing pattern, the impurity in extension regions 16 is prevented from being unduly diffused, and their junction to silicon substrate 11 can be made shallow and low in resistance.

Figure 3B:
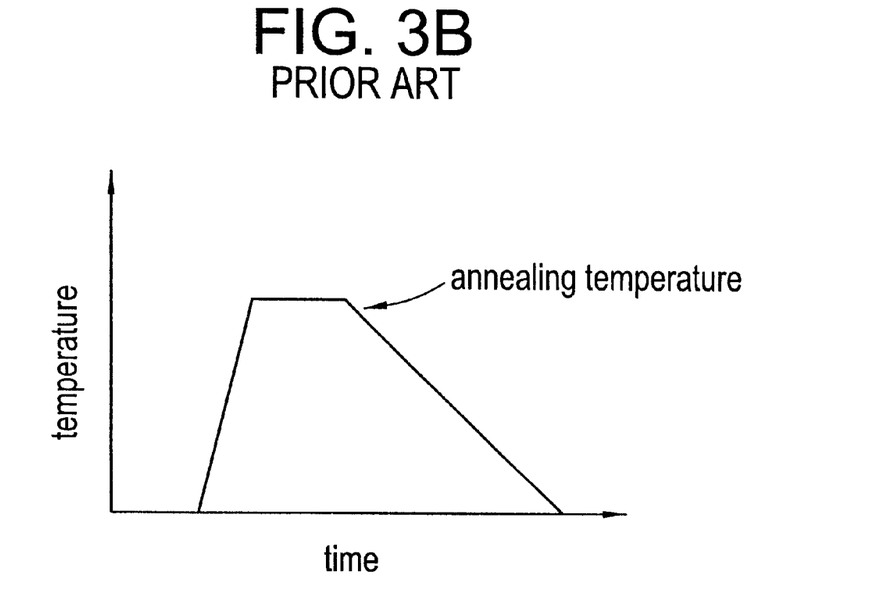
Figure 4A:
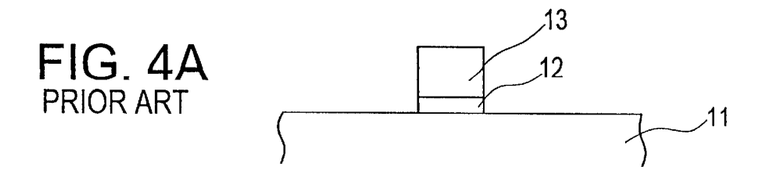
FIGS. 4A through 4F are schematic vertical cross-sectional views showing another method of manufacturing a MOS transistor.
Figure 4B:
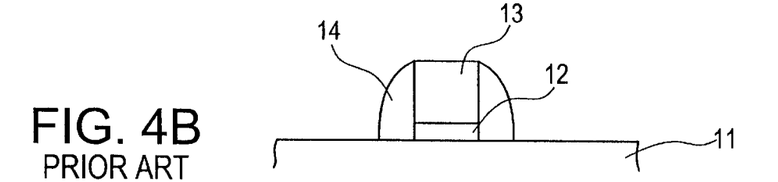
Figure 4C:
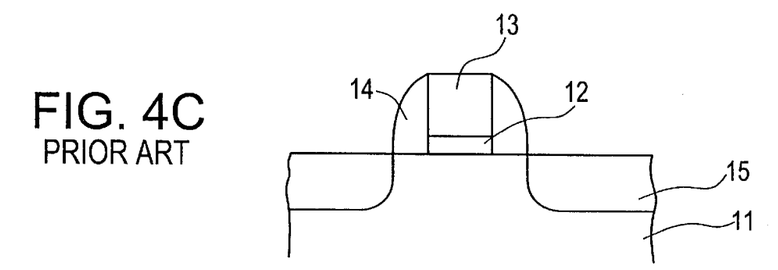
Figure 4D:
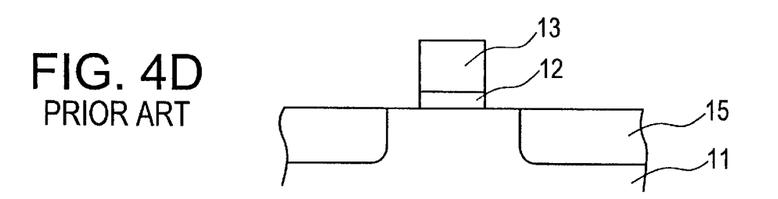
Figure 4E:
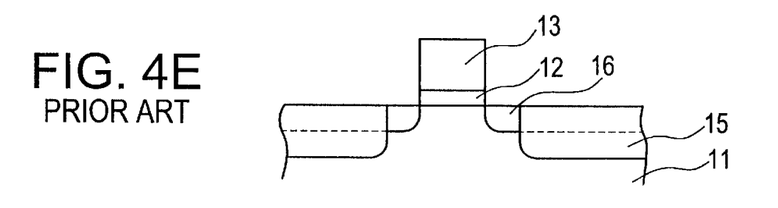
Figure 4F:
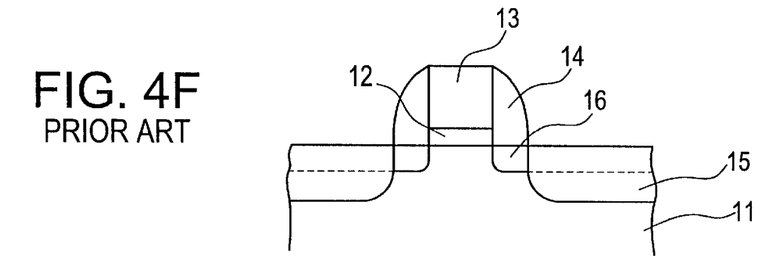

For annealing silicon substrate 10 to form source/drain region 15 and extension regions 16, a soak annealing pattern may be employed to keep the assembly at the annealing temperature for a certain period of time, as shown in FIG. 3B of the accompanying drawings. The soak annealing pattern requires more processing time than the spike annealing pattern, but has an annealing temperature which may not be as high as the annealing temperature of the spike annealing pattern.

According to another process of manufacturing such MOS transistor 10, as shown in FIGS. 4A through 4F of the accompanying drawings, using side walls 14 as a mask, silicon substrate 11 is deeply doped with a p-type impurity at the position of source/drain region 15 and then annealed. After side walls 14 are removed, using gate electrode 13 as a mask, silicon substrate 11 is lightly doped with a p-type impurity at the position of extension regions 16. Side walls 14 are then deposited again, and the assembly is annealed again.

The first annealing process for activating source/drain region 15 is a normal annealing process carried out for a long period of time, rather than the RTA process. Therefore, defects due to the ion implantation are well recovered. However, inasmuch as the second annealing process for activating extension regions 16 is the RTA process, the junction of extension regions 16 may be made shallow and low in resistance.

When an n-channel MOS transistor is produced together with above p-channel MOS transistor 10 to fabricate a CMOS (Complementary MOS) transistor, the productivity is high if the p- and n-type impurities can be activated in one annealing process.

In the annealing process, the n-type impurity tends to volatilize from silicon substrate 11, and the p-type impurity is liable to be diffused into silicon substrate 11. When the p- and n-type impurities injected into one silicon substrate 11 by ion implantation are simultaneously activated by the annealing process, if the surface of silicon substrate 11 has not been covered with a covering film such as an oxide film, then it is preferable to add a trace of oxygen in the atmosphere thereby to form an oxide film at the same time the assembly is annealed, thus preventing the n-type impurity from being volatilized.

With the oxide film being formed at the same time the assembly is annealed, however, the p-type impurity is also diffused into the oxide film, and hence the concentration of the p-type impurity is lowered. Since the p-type impurity of boron can easily be oxidized, the oxidization promotes its diffusion, increasing the depth of the junction.

In order to solve the above problems, the applicant has proposed a method of manufacturing a circuit in Japanese laid-open patent publication No. 2000-114197. According to the proposed method, a minimum trace of oxygen is added in the atmosphere whose temperature is increasing in an RTA process in which the diffusion of an impurity by way of TED (Transient Enhanced Diffusion) is noticeable and the diffusion of an impurity by way of OED (Oxidation Enhanced Diffusion) is small.

Because of the added trace of oxygen, a thermally oxidized film is produced as a cover film on the surface of silicon substrate 11 when the assembly is increased in temperature. Therefore, the n-type impurity is prevented from volatilizing to produce n-type extension regions of high concentration. According to the annealing process in the RTA process, since the temperature is increased and lowered at a high rate, the p-type impurity is diffused by TED, rather than OED, allowing p-type extension regions 16 of sufficient concentration to be produced with a shallow junction.

According to the above circuit manufacturing method, even when p- and n-type impurity regions are simultaneously activated by one annealing process, the n-type impurity can be prevented from volatilizing and the p-type impurity can be diffused by TED.

If the surface of silicon substrate 11 is not covered with a covering film such as an oxide film, then when the annealing gas comprises a main component of nitrogen and an added trace of oxygen, silicon substrate 11 is nitrided, tending to impair the uniformity of extension regions 16.

To prevent silicon substrate 11 from being nitrided, the annealing gas may comprise a main component of argon. However, since the thermal conductivity of argon is low, the rate at which the temperature is lowered is reduced. Because the impurity in extension regions 16 is unnecessarily diffused, their junction to silicon substrate 11 becomes shallow, resulting in an increase in resistance.

SUMMARY OF THE INVENTION

It is therefore an object of the present invention to provide a method of and an apparatus for manufacturing a circuit by keeping uniform a region where an impurity is activated when the impurity injected into a silicon substrate by ion implantation is annealed for activation, and making the junction between the region where the impurity is activated and the silicon substrate shallow and low in resistance.

In a method of manufacturing a circuit according to the present invention, a silicon substrate whose surface is not covered with a covering film and which contains an impurity injected therein by way of ion implantation is replaceably held by a wafer holding means. The temperature of the silicon substrate is increased and then lowered by a wafer temperature increasing means. When the temperature of the silicon substrate is increased by the wafer temperature increasing means, an annealing control means controls a first gas supply means to supply a first annealing gas, and when the temperature of the silicon substrate is lowered by the wafer temperature increasing means, the annealing control means controls a second gas supply means to supply a second annealing gas.

The first annealing gas is mainly composed of argon, for example, and does not react with the silicon substrate. Therefore, no unwanted reaction occurs on the silicon substrate whose temperature is increasing. The second annealing gas is mainly composed of nitrogen, for example, and has a high thermal conductivity. Therefore, the temperature of the silicon substrate is quickly lowered.

Various means referred to in the present invention may be arranged to perform their functions. For example, they may comprise dedicated hardware for performing given functions, a computer programmed to perform given functions, functions realized in a computer by a program, or a combination thereof.

The above and other objects, features, and advantages of the present invention will becomes apparent from the following description with reference to the accompanying drawings which illustrate examples of the present invention.

DETAILED DESCRIPTION OF THE PREFERRED EMBODIMENTS

Embodiments of the present invention will be described below with reference to FIGS. 5 through 9. Those parts of the embodiments of the present invention which are identical to those of the conventional arrangements are referred to by identical names and reference characters and will not be described in detail below.

Figure 6:
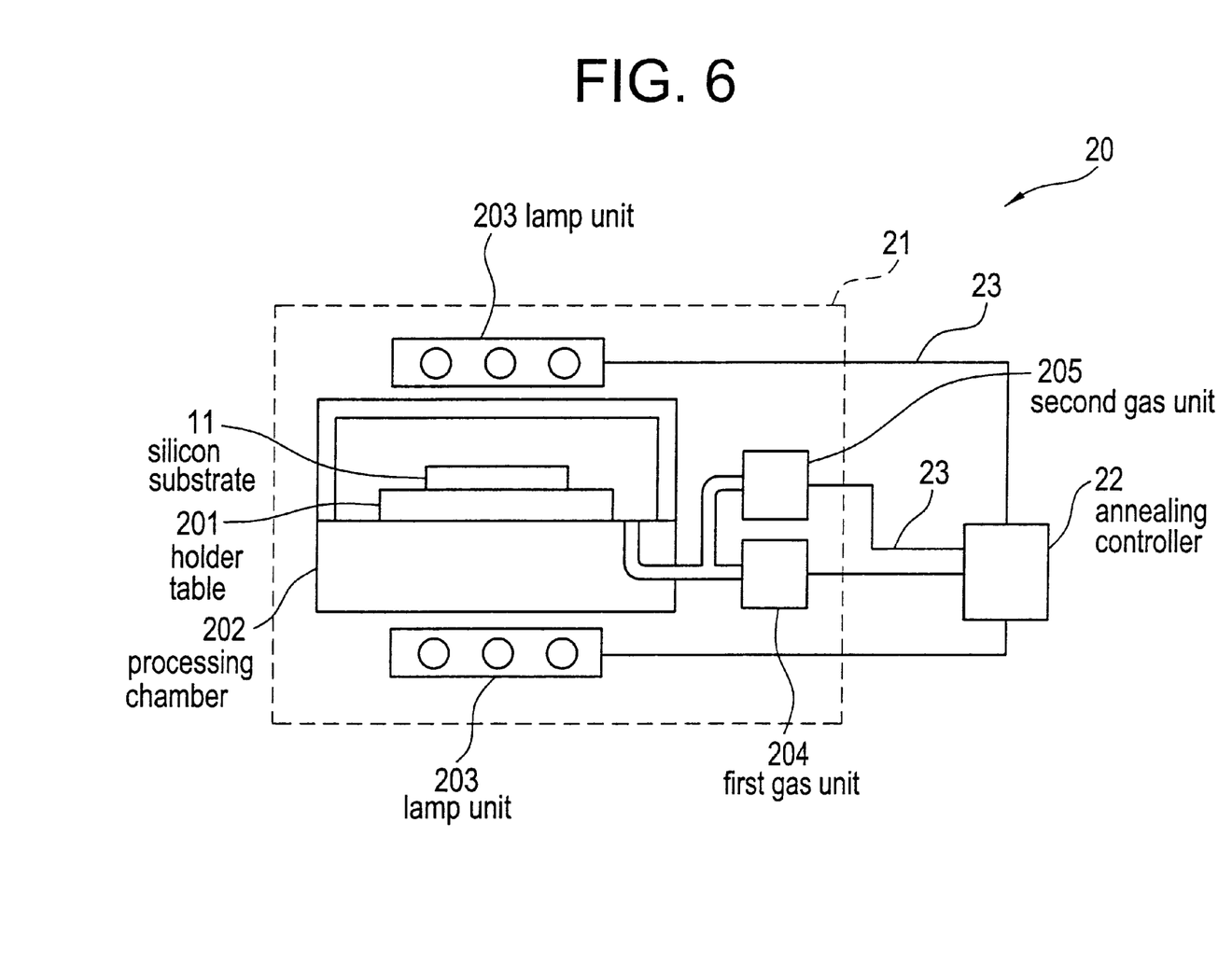
FIG. 6 is a schematic vertical cross-sectional view of an overall structure of an apparatus for manufacturing a circuit according to the present invention.

As shown in FIG. 6, apparatus 20 for manufacturing a circuit according to the present invention generally comprises annealing assembly 21 and annealing controller 22 as an annealing control means, which are connected to each other by connectors 23.

Annealing assembly 21 has holder table 201 as a wafer holding means disposed in a processing chamber 202 that serves as a heat-insulating hermetically sealing means. Holder table 201 serves to hold silicon substrate 11 replaceably. Processing chamber 202 hermetically seals and thermally insulates silicon substrate 11 held by holder table 201 from the exterior space.

Silicon substrate 11 held by holder table 201 does not have a covering film such as an oxide film on its surface, and contains impurities injected therein by way of ion implantation. Specifically, since a CMOS transistor is fabricated on silicon substrate 11, a p-type impurity of boron and an n-type impurity of phosphorus are injected in desired regions by way of ion implantation. These p- and n-type impurities are simultaneously activated in one annealing process by circuit manufacturing apparatus 20.

A pair of lamp units 203, serving as wafer temperature increasing means, are individually disposed above and below processing chambers 202, and first and second gas units 204, 205, serving as first and second gas supply means, are connected to processing chambers 202 by pipes. Lamp units 203 illuminate silicon substrate 11 held by holder table 201 to increase its temperature, and first and second gas units 204, 205 supply first and second annealing gases, respectively, to the position of silicon substrate 11 held by holder table 201. The first annealing gas is mainly composed of argon which has a low thermal conductivity and does not react with silicon substrate 11, and also contains a trace of oxygen, e.g., 1000 (ppm) of oxygen, added thereto. The second annealing gas is mainly composed of nitrogen, and can react with silicon substrate 11 and has a high thermal conductivity.

Figure 7:
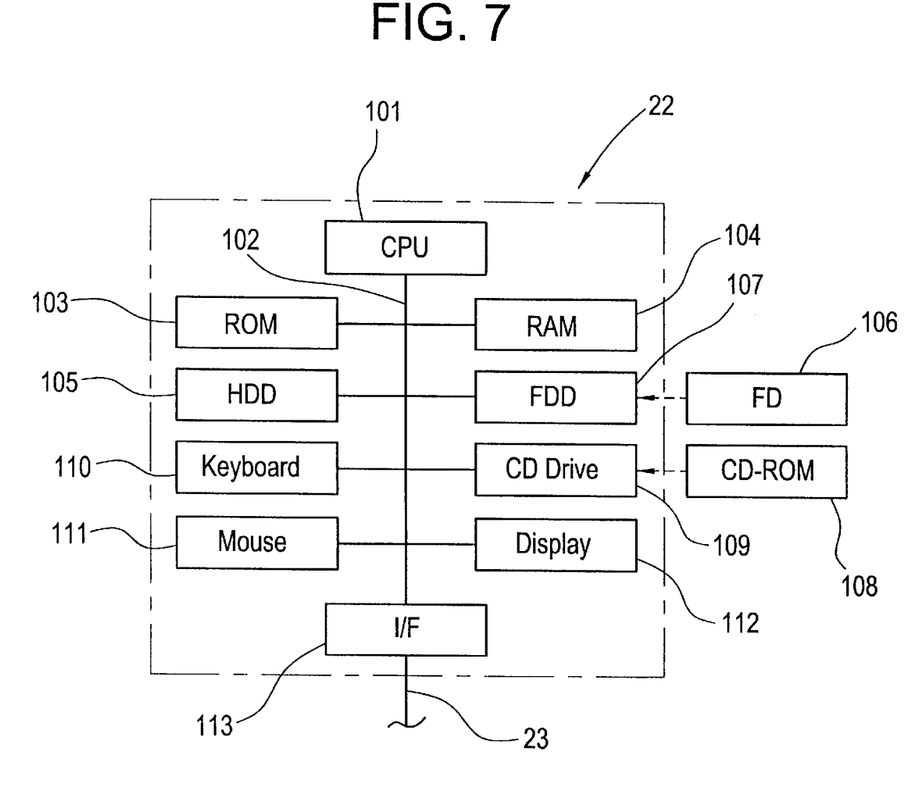
FIG. 7 is a block diagram of an annealing controller.

Annealing controller 22 comprises a computer system having, as shown in FIG. 7, CPU (Central Processing Unit) 101 as a main computer hardware unit. To CPU 101, there are connected, by bus lines 102, ROM (Read-Only Memory) 103, RAM (Random Access Memory) 104, HDD (Hard Disk Drive) 105, FDD (Floppy Disk Drive) 107 for loading FD (Floppy Disk) 106 replaceably, CD drive 109 for loading CD (Compact Disc)-ROM 108 replaceably, keyboard 110, mouse 111, display unit 112, and communication I/F (InterFace) 113. Communication I/F 113 is connected to connectors 23 that are connected to lamp units 203 and first and second gas units 204, 205 of annealing assembly 21.

In the circuit manufacturing apparatus 20, each of the hardware units including ROM 103, RAM 104, HDD 105, replaceable FD 106, replaceable CD-ROM 108 corresponds to an information storage medium. At least one of these information storage mediums store control programs and various data as software required to control various operations of annealing controller 22.

For example, a control program for enabling CPU 101 to perform various processing sequences is stored in advance in FD 106 and CD-ROM 108. Such software are installed in advance in HDD 105, and copied to RAM 104 and read by CPU 101 when annealing controller 22 is activated.

When CPU 101 reads the control program and executes various processing sequences, annealing controller 22 controls operation of lamp units 203 and first and second gas units 204, 205 of annealing assembly 21 in a combined manner.

Specifically, for increasing the temperature of silicon substrate 11 to a predetermined annealing temperature, annealing controller 22 energizes lamp units 203 and enables first gas unit 204 to supply the first annealing gas at a low rate. For lowering the temperature of silicon substrate 11 from the annealing temperature to a normal temperature, annealing controller 22 de-energizes lamp units 203 and enables second gas unit 205 to supply the second annealing gas at a high rate.

The above control function of annealing controller 22 may be performed by various pieces of hardware if desired. However, the control function is primarily performed by CPU 101 as computer hardware based on the software that is stored in the information storage medium such as RAM 104 or the like.

The software is stored in the information storage medium such as RAM 104 or the like as the control program for enabling CPU 101 to perform various processing sequences, e.g., to operate lamp units 203 and first gas unit 204 in order to increase the temperature of silicon substrate 11 and to shut down lamp units 203 and operate second gas unit 204 in order to lower the temperature of silicon substrate 11.

Circuit manufacturing apparatus 20 anneals silicon substrate 11 whose surface has not been covered with a covering film such as an oxide film and which contains an impurity of boron injected by way of ion implantation, for thereby activating the boron to produce p-type source/drain region 15 and extension regions 16.

For thus annealing silicon substrate 11, as shown in FIG. 6, silicon substrate 11 is held by holder table 201 in processing chamber 202, and annealing controller 22 controls operation of lamp units 203 and first and second gas units 204, 205 of annealing assembly 21.

Figure 5:
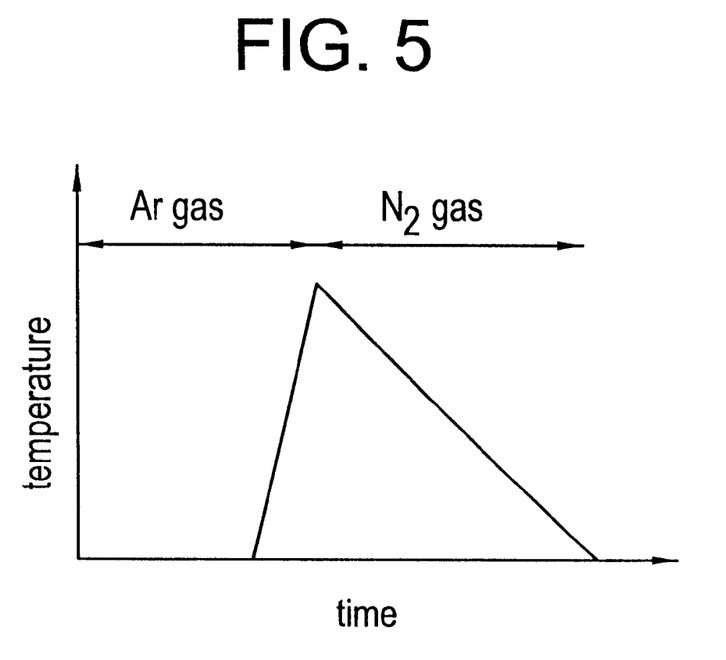
FIG. 5 is a diagram showing the characteristics of a method of manufacturing a circuit according to the present invention.
Figure 8:
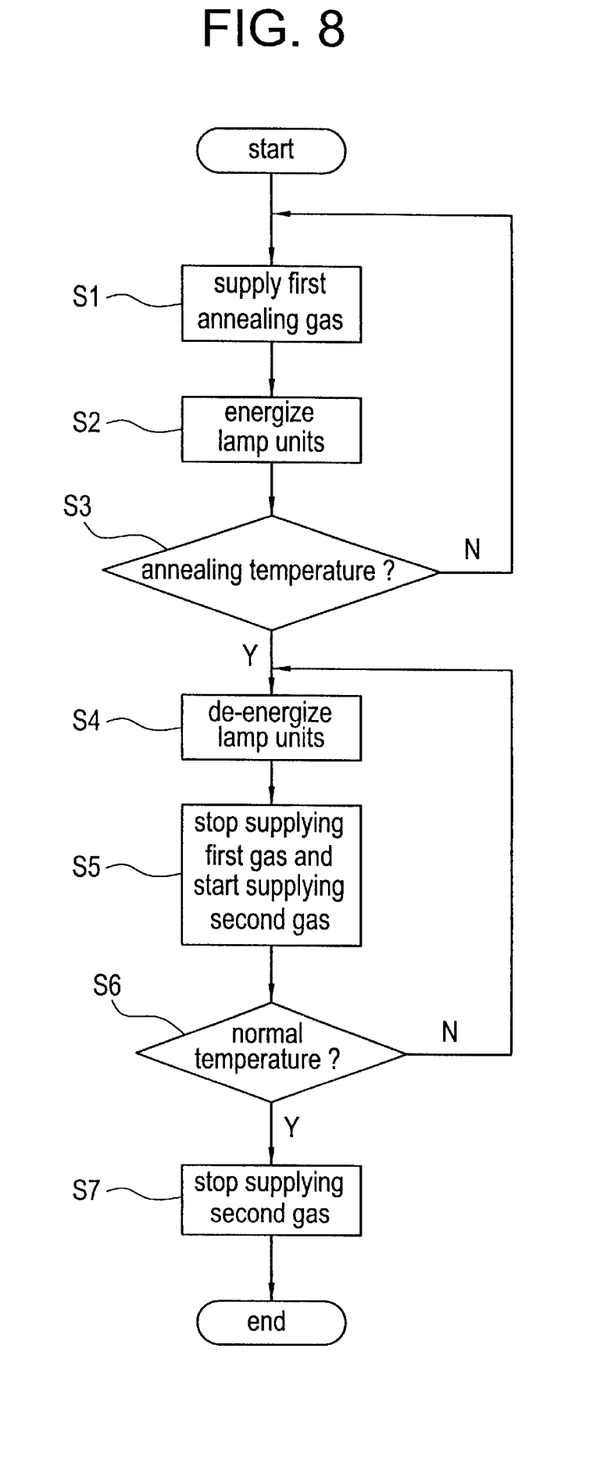
FIG. 8 is a flowchart of the method of manufacturing a circuit, which is carried out by the apparatus for manufacturing a circuit according to the present invention.

Specifically, as shown in FIGS. 5 and 8, annealing controller 22 controls first gas unit 204 to supply the first annealing gas, which is mainly composed of argon with an added trace of oxygen, at a low rate to the position of silicon substrate 11 in step S1, and energizes lamp units 203 to increase the temperature of silicon substrate 11 to the predetermined annealing temperature in step S2.

If the temperature of silicon substrate 11 reaches the predetermined annealing temperature in step S3, then annealing controller 22 de-energizes lamp units 203 in step S4 and controls first gas unit 204 to stop supplying the first annealing gas and second gas unit 205 to start supplying the second annealing gas, which is composed of nitrogen, at a high rate in step S5, thereby immediately starting lowering the temperature of silicon substrate 11.

In this manner, the second annealing gas is supplied from second gas unit 205 at the high rate to silicon substrate 11 while lamp units 203 are being deenergized. If the temperature of silicon substrate 11 is lowered to the normal temperature in step S6, then annealing controller 22 controls second gas unit 205 to stop supplying the second annealing gas in step S7.

In the above circuit manufacturing process carried out by circuit manufacturing apparatus 20, as described above, the first annealing gas, which is mainly composed of argon with an added trace of oxygen, is supplied to silicon substrate 11 when the temperature of silicon substrate 11 is increased. Therefore, any unwanted reaction such as nitridation does not occur on silicon substrate 11 whose temperature is increasing, so that p-channel MOS transistor 10 and n-channel MOS transistor (not shown) can maintain their desired characteristics.

Since a thermally oxidized film is produced on the surface of silicon substrate 11 because of the trace of oxygen added to the first annealing gas, the n-type impurity (not shown) injected in silicon substrate 11 is prevented from volatilizing, allowing n-type extension regions 16 of n-channel MOS transistor to be produced at a sufficient concentration.

The second annealing gas, which is composed of nitrogen, is supplied to silicon substrate 11 when the temperature of silicon substrate 11 is lowered. Therefore, the temperature of silicon substrate 11 can quickly be lowered by nitrogen whose thermal conductivity is high. Therefore, the annealing process is carried out as the RTA process which causes most of the diffusion to take place as TED rather than OED, so that the boron in p-type extension regions 16 is prevented from being undesirably diffused, making shallow and low in resistance their junction to silicon substrate 11.

In the above embodiment, silicon substrate 11 is annealed according to a spike annealing pattern in which the temperature of silicon substrate 11 is lowered immediately after it has reached the annealing temperature.

Figure 9:
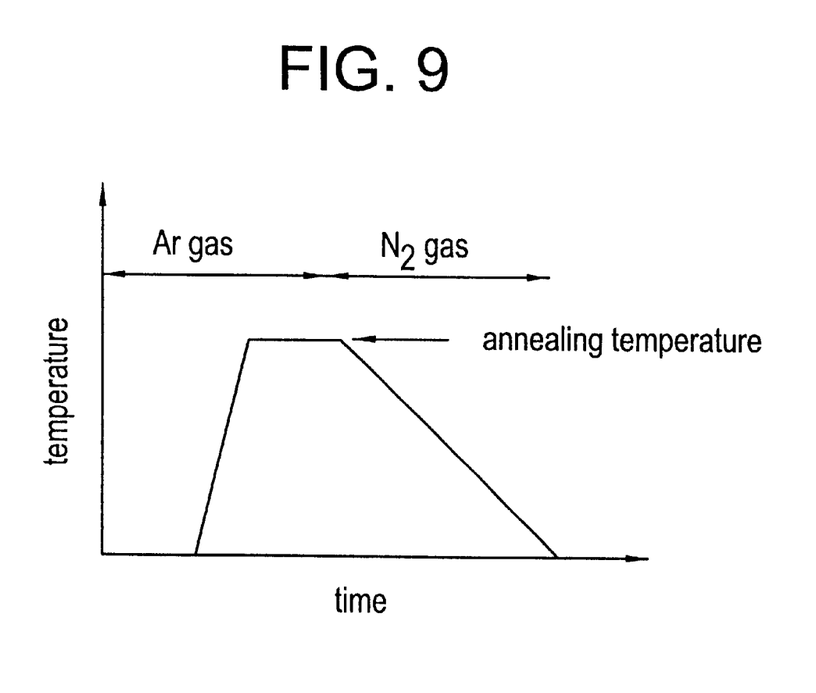
FIG. 9 is a diagram showing the characteristics of a method of manufacturing a circuit according to a modification of the present invention.

However, as shown in FIG. 9, silicon substrate 11 may be annealed according to a soak annealing pattern in which silicon substrate 11 is kept at the annealing temperature for a certain period of time. In the soak annealing pattern, the first annealing gas may switch to the second annealing gas when the increasing of the temperature is completed, when the annealing temperature is maintained, or when the lowering of the temperature is started, for example.

In the above embodiment, for lowering the temperature of silicon substrate 11, the second annealing gas is supplied at a maximum rate at all times to lower the temperature of silicon substrate 11 at a maximum uniform rate. However, the second annealing gas may be supplied at a rate that is adjusted to lower the temperature of silicon substrate 11 initially at a maximum rate and then at a low rate from some point in the temperature increasing process.

In this modification, since the rate for lowering the temperature of silicon substrate 11 is high until some point in the temperature increasing process, the impurity in extension regions 16 is prevented from being undesirably diffused. Because the rate for lowering the temperature of silicon substrate 11 becomes low from that point in the temperature increasing process, the stress of silicon substrate 11 is lessened to prevent various parts thereof from damaged or peeled off.

The rate for lowering the temperature of silicon substrate 11 should preferably be set to such a value that the thermal energy for cutting off the bond to silicon substrate 11 will not be exerted to the impurity whose level of solid solution has been reduced due to the reduction in the temperature. For example, if the impurity injected in silicon substrate 11 by way of ion implantation is boron, then it is preferable to increase the temperature of silicon substrate 11 to the annealing temperature of 1000° C., then lower the temperature of silicon substrate 11 to 900° C. at a high rate of 50° C./sec., and subsequently lower the temperature of silicon substrate 11 at a low rate of 25° C./sec.

Specifically, when the temperature of silicon substrate 11 is lowered from the annealing temperature, the level of solid solution of the injected impurity is also lowered, and hence the bond between the impurity and silicon substrate 11 tends to be cut off easily. In order to cut off the bond between the impurity and silicon substrate 11, it is necessary to apply a sufficient amount of thermal energy, which is necessarily greater as the temperature of silicon substrate 11 is higher. Thus, the bond between the impurity and silicon substrate 11 can be cut off more easily at a lower temperature from the standpoint of solid solution and more easily at a higher temperature from the standpoint of thermal energy.

The result of an actual examination conducted by the inventor of the present invention indicates that the time required for cutting off the bond between the impurity and silicon substrate 11 was about 0.5 min. at 900° C., bout 5.0 min. at 800° C., and about 60 min. at 700° C. Therefore, if the time consumed to lower the temperature of silicon substrate 11 from 1000° C. to 900° C. is 0.5 min. or more, then the bond between the impurity and silicon substrate 11 is cut off. Similarly, if the time consumed to lower the temperature of silicon substrate 11 to 800° C. is 5.0 min. or more, or the time consumed to lower the temperature of silicon substrate 11 to 700° C. is 60 min. or more, then the bond between the impurity and silicon substrate 11 is cut off.

Stated otherwise, if the time spent to lower the temperature of silicon substrate 11 from 1000° C. to 900° C. is sufficiently shorter than 0.5 min., then the bond between the impurity and silicon substrate 11 is prevented from being cut off. Similarly, if the time spent to lower the temperature of silicon substrate 11 to 800° C. or 700° C. is sufficiently shorter than 5.0 min. or 60 min., then the bond between the impurity and silicon substrate 11 is prevented from being cut off.

The relationship between the temperature and the time shows that since the allowed time increases rapidly as the temperature is lowered, the rate for lowering the temperature of silicon substrate 11 from the annealing temperature needs to be high at high temperatures, but may be low at low temperatures.

If the rate for lowering the temperature of silicon substrate 11 is low in such a range as to prevent the thermal energy for cutting off the bond between the impurity and silicon substrate 11 from being exerted to the impurity whose level of solid solution has been reduced due to the reduction in the temperature, then the impurity injected in silicon substrate 11 by way of ion implantation is not undesirably diffused, and the stress of silicon substrate 11 is minimized.

In the above embodiment, the impurities in the p- and n-type regions of the CMOS transistor are simultaneously activated by the annealing process. However, the annealing process according to the present invention may be used to activate only the p-type region of p-channel MOS transistor 10 or the n-type region of n-channel MOS transistor, and can be applied to various circuits insofar as they employ a silicon substrate with an impurity injected thereby by way of ion implantation.

In the above embodiment, CPU 101 operates according to the control program that is stored as software in RAM 104 or the like, for logically realizing the various means as the functions of annealing controller 22. However, each of those means may be constructed as an inherent piece of hardware, or may partly be stored as software in RAM 104 or the like and partly be constructed as a piece of hardware.

In the above embodiment, the software installed in advance from CD-ROM 108 or the like into HDD 105 is copied to RAM 104 and then read from RAM 104 by CPU 101 when annealing controller 22 is activated. However, the software may be used by CPU 101 while it remains stored in HDD 105, or may fixedly be stored in advance in ROM 103.

The software may be stored in FD 106 or CD-ROM 108, each serving as an information storage medium that can be handled individually, and may then be installed from FD 106 or CD-ROM 108 into HDD 105 or RAM 104. However, the software may directly be read from FD 106 or CD-ROM 108 by CPU 101, rather than being installed into HDD 105 or RAM 104, for performing various processing sequences.

Therefore, if the various means of annealing controller 22 are software-implemented, then annealing controller 22 may be arranged to cause CPU 101 to read the software and perform corresponding processing sequences. The control program for realizing the above various means may be constructed of a combination of various pieces of software. In such a case, an information storage medium as an individual unit may stored only a minimum piece of software for achieving the functions of annealing controller 22.

For example, if annealing controller 22 with an existing operating system is to be supplied with a software application from an information storage medium such as CD-ROM 108 or the like, then since the software for achieving the functions of annealing controller 22 is realized by a combination of the software application and the operating system, the software depending on the operating system may be omitted from the software application stored in the information storage medium.

The supply of the software stored in the information storage medium to CPU 101 is not limited to the direct loading of the information storage medium into annealing controller 22. The software may be stored in an information storage medium of a host computer, the host computer may be connected to a terminal computer by a communication network, and the software may be supplied from the host computer to the terminal computer via data communications.

In the above case, the terminal computer may perform stand-alone processing sequences with the software downloaded in its own information storage medium. However, the terminal computer may perform processing sequences through real-time data communications with the host computer without downloading the software from the host computer. In this case, the entire system made up of the host computer and the terminal computer that are connected to each other by the communication network corresponds to annealing controller 22.

In the method of manufacturing a circuit carried out by the circuit manufacturing apparatus according to the present invention, the first annealing gas, which is mainly composed of argon which does not react with the silicon substrate, and also contains a trace of oxygen added thereto, is supplied when the temperature of the silicon substrate is increased, and the second annealing gas, which is mainly composed of nitrogen and has a high thermal conductivity, is supplied when the temperature of the silicon substrate is lowered. In this manner, any unwanted reaction is prevented from occurring on the silicon substrate whose temperature is increasing, and the temperature of the silicon substrate can be lowered quickly. Therefore, the p-type impurity doped in the silicon substrate which will be fabricated into a MOS transistor is prevented from being undesirably diffused, making the junction shallow and low in resistance.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a circuit by annealing a silicon substrate whose surface is not covered with a covering film to activate an impurity doped therein for producing lightly doped shallow regions together inwardly of deeply doped source/drain regions of p- and n-channel MOS transistors of a CMOS transistor, comprising the steps of:

increasing a temperature of the silicon substrate to a predetermined annealing temperature in an atmosphere of a first annealing gas which is mainly composed of a gas that does not react with said silicon substrate with a trace of oxygen added thereto; and lowering the temperature of the silicon substrate which has been increased to said annealing temperature in an atmosphere of a second annealing gas which has a high thermal conductivity, for thereby producing said lightly doped shallow regions.

2. A method according to claim 1, wherein said first annealing gas is mainly composed of argon with a trace of oxygen added thereto, and said second annealing gas is mainly composed of nitrogen.

3. A method of manufacturing a circuit by annealing a silicon substrate whose surface is not covered with a covering film to activate a p-type impurity doped therein, comprising the steps of:

increasing a temperature of the silicon substrate to a predetermined annealing temperature in an atmosphere of a first annealing gas which is mainly composed of a gas that does not react with said silicon substrate with a trace of oxygen added thereto; and lowering the temperature of the silicon substrate which has been increased to said annealing temperature in an atmosphere of a second annealing gas which has a high thermal conductivity.

4. A method according to claim 2, wherein said first annealing gas is mainly composed of argon with a trace of oxygen added thereto, and said second annealing gas is mainly composed of nitrogen.

* * * * *